United States Patent
Cao et al.

(10) Patent No.: US 9,953,968 B2
(45) Date of Patent: Apr. 24, 2018

(54) INTEGRATED CIRCUIT HAVING AN ESD PROTECTION STRUCTURE AND PHOTON SOURCE

(71) Applicant: Infineon Technologies AG, Neubiberg (DE)

(72) Inventors: Yiqun Cao, Munich (DE); Ulrich Glaser, Putzbrunn (DE); Magnus-Maria Hell, Munich (DE); Julien Lebon, Munich (DE); Michael Mayerhofer, Taufkirchen (DE); Andreas Meiser, Sauerlach (DE); Matthias Stecher, Munich (DE); Joost Willemen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 481 days.

(21) Appl. No.: 14/628,823

(22) Filed: Feb. 23, 2015

(65) Prior Publication Data
US 2015/0249078 A1    Sep. 3, 2015

(30) Foreign Application Priority Data
Feb. 28, 2014    (DE) .................. 10 2014 102 714

(51) Int. Cl.
*H02H 9/04*    (2006.01)
*H01L 27/02*    (2006.01)

(52) U.S. Cl.
CPC ...... *H01L 27/0255* (2013.01); *H01L 27/0292* (2013.01); *H02H 9/046* (2013.01)

(58) Field of Classification Search
CPC ........... H02H 9/04; H02H 9/041; H02H 9/046
(Continued)

(56) References Cited

U.S. PATENT DOCUMENTS

| | | |
|---|---|---|
| 6,629,247 B1 | 9/2003 | Hall et al. |
| 2009/0230476 A1 | 9/2009 | Krutsick |

(Continued)

FOREIGN PATENT DOCUMENTS

| | | |
|---|---|---|
| CN | 101385143 A | 3/2009 |
| CN | 101859763 A | 10/2010 |

(Continued)

OTHER PUBLICATIONS

Li, K. et al., "SiC Avalanche Photodiode Array with Microlenses", Optics Express, vol. 18, No. 11, May 24, 2010, pp. 11713-11719.
(Continued)

*Primary Examiner* — Dharti Patel
(74) *Attorney, Agent, or Firm* — Murphy, Bilak & Homiller, PLLC

(57) ABSTRACT

An integrated circuit having an ESD protection structure is described. One embodiment includes a circuit section interconnected with a first terminal and with a second terminal and being operable at voltage differences between the first terminal and second terminal of greater than +10 V and less than −10 V. The integrated circuit additionally includes an ESD protection structure operable to protect the circuit section against electrostatic discharge between the first terminal and the second terminal. The ESD protection structure is operable with voltage differences between the first and second terminals of greater than +10 V and less than −10 V without triggering. The ESD protection structure is electrically and optically coupled to a photon source such that photons emitted by the photon source upon ESD pulse loading are absorbable in the ESD protection structure and an avalanche breakdown is initiatable by electron-hole pairs generated by the absorbed photons.

25 Claims, 12 Drawing Sheets

(58) Field of Classification Search
USPC .......................................................... 361/56
See application file for complete search history.

(56) References Cited

U.S. PATENT DOCUMENTS

| | | |
|---|---|---|
| 2009/0250706 A1 | 10/2009 | Krutsick |
| 2010/0259857 A1* | 10/2010 | Mayerhofer ............ H01L 23/60 |
| | | 361/56 |
| 2012/0099229 A1 | 4/2012 | Domanski et al. |
| 2014/0001840 A1 | 1/2014 | Lenz et al. |

FOREIGN PATENT DOCUMENTS

| | | |
|---|---|---|
| CN | 102301831 A | 12/2011 |
| DE | 102010016372 A1 | 10/2010 |
| JP | 2001110993 A | 4/2001 |
| TW | 200635025 A | 10/2006 |
| TW | 201306416 A | 2/2013 |
| TW | 201316674 A | 4/2013 |

OTHER PUBLICATIONS

Muszalski, J. et al., "Low Dark Current InGaAs/InAlAs/InP Avalanche Photodiode", Journal of Physics: Conference Series, vol. 146, No. 1, 2009, pp. 1-6.

* cited by examiner

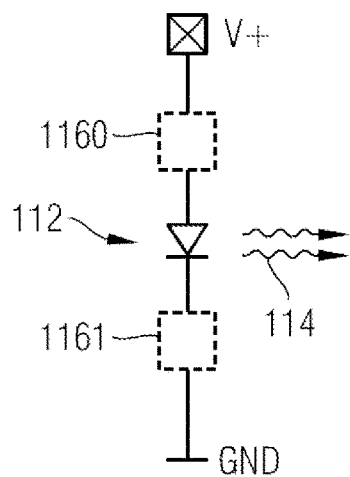
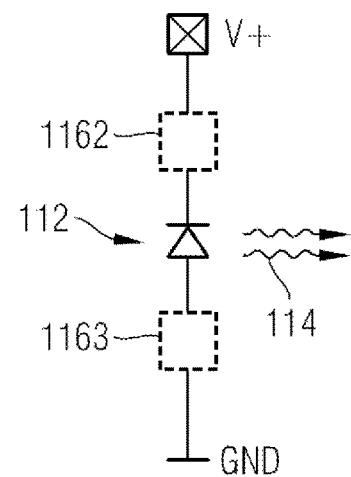
FIG 3A    FIG 3B
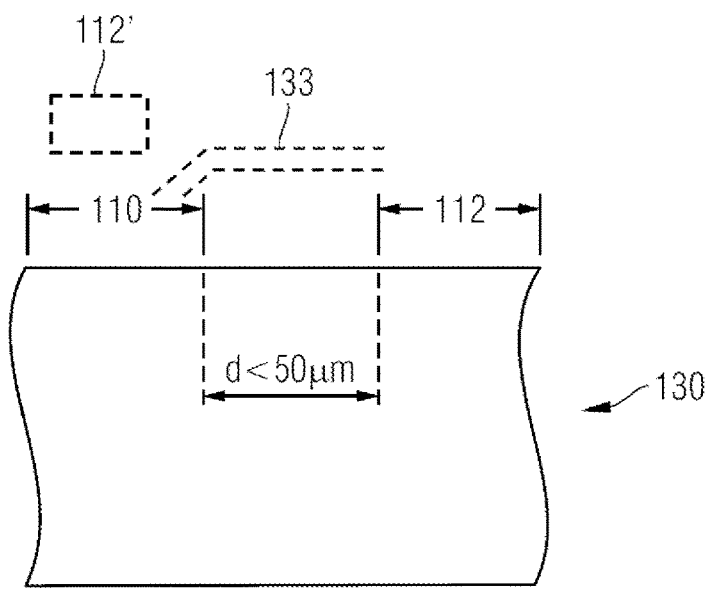
FIG 4

INTEGRATED CIRCUIT HAVING AN ESD PROTECTION STRUCTURE AND PHOTON SOURCE

PRIORITY CLAIM

This application claims priority to German Patent Application No. 10 2014 102 714.0 filed on 28 Feb. 2014, the content of said application incorporated herein by reference in its entirety.

BACKGROUND

Protection structures against electrostatic discharges (electrostatic discharge (ESD) protection structures) are widely used in semiconductor technologies in order to protect circuit blocks against electrostatic discharge during mounting and operation. These ESD protection structures are intended to be able to carry away discharge currents rapidly and reliably in order to prevent destruction of the circuit blocks to be protected by the discharge currents.

The protection properties of the ESD protection structures are specified here with reference to ESD test standards. Besides ESD test standards at the component or IC level (integrated circuit) such as, for example, the test according to the human body model (HBM), which is standardized for instance by the ESD Association & JEDEC Solid State Technology Association, ESD test standards at the system level, in particular, make stringent requirements of the ESD protection structures. One common ESD standard at the system level is IEC 61000-4-2. The particularly stringent requirements made of ESD protection structures by ESD standards at the system level become clear for example upon comparison of the peak currents and rise times that result from the standards at a loading voltage of 2 kV. While an ESD pulse according to the human body model (HBM) entails a peak current of approximately 1.3 A with a rise time of approximately 2-10 ns at a loading voltage of 2 kV, a peak current of above 6 amperes with a rise time of typically below 1 ns results at a loading voltage of 2 kV in the case of an ESD pulse according to the IEC standard. Consequently, particular requirements such as rapid reaction time and high robustness are made particularly of ESD protection structures in integrated circuits which are intended to satisfy requirements in respect of ESD test standards at the system level.

It is an object of the invention to specify an integrated circuit comprising an ESD device which satisfies the above requirements.

SUMMARY

According to an embodiment of an integrated circuit, the integrated circuit comprises a circuit section interconnected with a first terminal and with a second terminal and operable at voltage differences between the first terminal and the second terminal of greater than +10 V and less than −10 V. The integrated circuit further comprises an ESD protection structure operable to protect the circuit section against ESD loading between the first terminal and the second terminal. The ESD protection structure is operable with voltage differences between the first and second terminals of greater than +10 V and less than −10 V without triggering. The ESD protection structure is electrically and optically coupled to a photon source so that photons emitted by the photon source upon ESD loading are absorbable in the ESD protection structure and an avalanche breakdown is initiatable by electron-hole pairs generated by the absorbed photons.

According to another embodiment of an integrated circuit, the integrated circuit comprises a circuit section interconnected with a first terminal and with a second terminal and operable at a positive voltage difference between the first terminal and second terminal of above +10 V. The integrated circuit further comprises an ESD protection structure operable to protect the circuit section against electrostatic discharge between the first terminal and the second terminal. The ESD protection structure is operable with a positive voltage difference between the first and second terminals of above +10 V without triggering. The ESD protection structure is electrically and optically coupled to a photon source such that photons emitted by the photon source upon ESD pulse loading are absorbable in the ESD protection structure and an avalanche breakdown is initiatable by electron-hole pairs generated by the absorbed photons. A leakage current consumption between the first terminal and the second terminal at a specified positive maximum voltage is less than 100 nA and an input capacitance between the first terminal and the second terminal is less than 50 pF.

Those skilled in the art will recognize additional features and advantages upon reading the following detailed description, and upon viewing the accompanying drawings.

BRIEF DESCRIPTION OF THE FIGURES

Embodiments of the invention are described in greater detail below with reference to the figures. The figures are not true to scale. The features of the various embodiments can be combined with one another, provided that they are not mutually exclusive. Similar or corresponding reference identifications can be used for designating similar or corresponding parts.

FIG. 3A shows one embodiment of the photon source illustrated in FIG. 1, wherein photons are emittable from the photon source as a result of charge carrier recombination from a pn junction operated in the forward direction in silicon.

FIG. 3B shows a further embodiment of the photon source illustrated in FIG. 1, wherein photons are emittable from the photon source as a result of charge carrier acceleration of a pn junction operated in electrical breakdown in silicon.

FIG. 4 shows a schematic cross-sectional view of a semiconductor body in which the ESD protection structure and the photon source are formed and have a lateral distance of less than 50 μm.

DETAILED DESCRIPTION

In the following detailed description reference is made to the accompanying drawings, which form part of the disclosure and show for illustration purposes specific exemplary embodiments in which the invention can be implemented. It should be understood that other exemplary embodiments can be adduced and structural or logical changes can be made without departing from the scope of the present invention. By way of example, features illustrated or described for one exemplary embodiment can be used in or in association with other exemplary embodiments in order to arrive at yet another exemplary embodiment. The intention is for the present invention to include such modifications and variations. The examples are described by means of a specific language which should not be interpreted as limiting the scope of the enclosed patent claims. The drawings are not true to scale and serve merely for illustration purposes. For the sake of clarity, the same elements are provided with corresponding reference signs in the various drawings, unless stated otherwise.

The terms "have", "contain", "comprise", and the like are open terms, and these terms indicate the presence of the stated structure, elements or features, but do not rule out elements or features in addition. The indefinite article and the definite articles are intended to encompass both the plural and the singular, unless clearly indicated otherwise by the context.

The term "electrically connected" describes a permanent low-resistance connection between electrically connected elements, for example a direct contact between the relevant elements or a low-resistance connection via a metal and/or a highly doped semiconductor.

Figure 1:
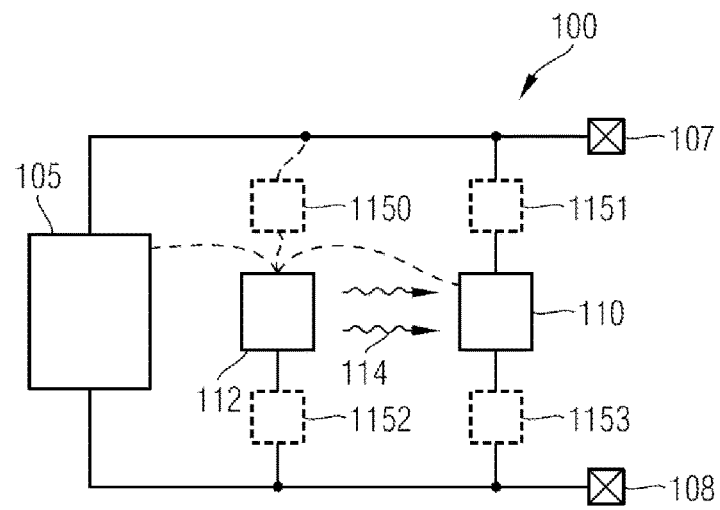
FIG. 1 shows a schematic circuit diagram of part of an integrated circuit in which a circuit section is protected against electrostatic discharge pulses by an ESD protection structure and a photon source electrically and optically coupled thereto.

FIG. 1 shows a schematic circuit diagram of part of an integrated circuit 100 in accordance with one embodiment. The integrated circuit 100 comprises a circuit section 105 which is interconnected with a first terminal 107 and with a second terminal 108.

Embodiments of the integrated circuit comprise transceivers such as, for example, LIN, CAN, FlexRay, sensor interfaces such as, for example, Hall sensor interfaces, buckle switch interfaces, battery sensor interfaces, active peripheral sensor interfaces, distributed system interfaces (e.g. DSI, DSI3), peripheral sensor interfaces (e.g. PSI5), HV (high-voltage) voltage sensor pins, monitor pins, position sensors or else switch feedback units, actuator interfaces such as, for example, HS (high side) switches, LS (low side) switches, half-bridges, full bridges, voltage and switch monitor pins, and overvoltage-tolerant or HV inputs and outputs.

The integrated circuit 100 additionally comprises an ESD protection structure 110 suitable for protecting the circuit section 105 against electrostatic discharge between the first terminal 107 and the second terminal 108. In this case, the electrostatic discharge can take place at the component level, e.g. in the context of the front-end and back-end manufacture of the ICs, and also at the system level, e.g. in the context of the mounting or operation of populated circuit boards, modules, devices.

The ESD protection structure 110 is electrically and optically coupled to a photon source 112 in such a way that photons 114 emitted by the photon source 112 upon ESD loading are absorbable in the ESD protection structure 110 and an avalanche breakdown is initiatable in the ESD protection structure 110 by means of the electron-hole pairs generated by the absorbed photons 114. Consequently, the photons 114 emitted by the photon source 112 are suitable for being absorbed in the ESD protection structure 110, and the electron-hole pairs generated in the process initiate the triggering process within the ESD protection structure 110, i.e. the dissipation of the electrostatic discharge current. The triggering process begins with inception of avalanche breakdown in the ESD protection structure 110. In this case, triggering is defined as a transition between a blocking state of the ESD protection structure 110, e.g. at voltages below the breakdown voltage of the ESD protection structure 110, and a state in which the ESD protection structure 110 carries away an ESD discharge current, hence conducting or switched-on state of said ESD protection structure, e.g. at voltages greater than or equal to the breakdown voltage of the ESD protection structure 110.

In this case, the photon source 112 is electrically coupled to the ESD protection structure in a suitable manner. In accordance with one embodiment, at least one terminal of the ESD protection structure 110 and a terminal of the photon source 112 are electrically short-circuited, e.g. via one or more connections composed of metallic materials and/or highly doped semiconductor materials such as highly doped polysilicon. In accordance with one embodiment, the first terminal 107 is short-circuited both with the ESD protection structure 110 and with the photon source 112, and the second terminal 108 is likewise short-circuited both with the ESD protection structure 110 and with the photon source 112. In accordance with further embodiments, further circuit elements are interconnected between the ESD protection structure 110 and/or the photon source 112 and the first terminal 107, cf. for instance circuit elements in optional circuit parts 1150 and 1151 between the first terminal 107 and the photon source 112 and, respectively, the ESD protection structure 110 in FIG. 1 or else circuit elements in optional circuit sections 1152 and 1153 between the second terminal 108 and the photon source 112 and, respectively, the ESD protection structure 110 in FIG. 1.

By way of example, the circuit section 1150 . . . 1153 can comprise a resistor, a JFET (junction field effect transistor) or a depletion mode FET (field effect transistor) in order to provide a current-limiting element for the photon source 112. In accordance with another embodiment, the optional circuit section 1150 . . . 1153 comprises a differentiating network composed of a capacitor and an optional resistor connected in series therewith, in order to enable an appreciable current flow through the photon source 112 only in the case of steep transient voltage edges. Consequently, by way of example, a DC current flow through the photon source 112 can be suppressed and transient current peaks occur during voltage transients. If the circuit sections 1150 . . . 1153 illustrated optionally in FIG. 1 are absent, then the corresponding terminals of the ESD protection structure 110 and of the photon source 112 are electrically short-circuited with the associated terminals, i.e. the first terminal 107 and the second terminal 108, respectively. In accordance with one embodiment, the photon source 112 is interconnected with the circuit section 105, e.g. connected to an ESD secondary protection structure within the circuit section 105 (various connection possibilities for the photon source 112 are illustrated by dashed lines in FIG. 1).

In accordance with one embodiment, the circuit section 105 is operable at voltage differences between the first terminal and the second terminal of greater than +10 V and/or less than −10 V. In accordance with this embodiment, the ESD protection structure 110 is also operable with voltage differences between the first terminal 107 and the second terminal 108 of greater than +10 V and/or less than −10 V without triggering. In this case, triggering is defined as a transition between a blocking state of the ESD protection structure 110, e.g. at voltages below the breakdown voltage of the ESD protection structure 110, and a state in which the ESD protection structure 110 carries away an ESD discharge current, hence conducting or switched-on state of said ESD protection structure, e.g. at voltages greater than or equal to the breakdown voltage of the ESD protection structure 110. By way of example, the triggering of the ESD protection structure 110 can be initiated by an electrical breakdown within the ESD protection structure 110. The breakdown current can rise further and further here in the case of a simple pn diode and carry away the currents in the amperes range which flow in the context of electrostatic discharges for a short time, e.g. in the picoseconds range, nanoseconds range or microseconds range, or else can for its part trigger a parasitic bipolar transistor formed in the ESD protection structure, e.g. by driving a base/emitter junction for example by means of a voltage drop brought about across a bulk resistance by the breakdown current. In accordance with further embodiments, the circuit section 105 is operable at voltage differences between the first terminal and the second terminal of greater than +20 V or even +30 V and/or less than −20 V or even −30 V.

Figure 2A:
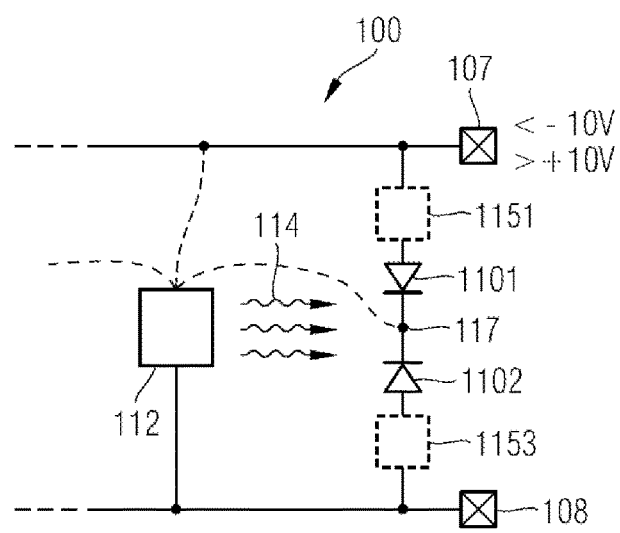
FIG. 2A shows one embodiment of the ESD protection structure illustrated in FIG. 1 with two antiseries-interconnected ESD protection diodes.

An embodiment of the ESD protection structure 110 which is suitable for being operated with voltage differences between the first terminal 107 and the second terminal 108 of greater than +10 V and less than −10 V is illustrated in the schematic circuit diagram in FIG. 2A. The ESD protection structure 110 comprises two antiseries-interconnected ESD protection diodes 1101, 1102. The ESD protection diodes 1101, 1102 are in this case electrically connected by their cathodes or their anodes to a terminal point 117. In accordance with one embodiment, the terminal point 117 is electrically connected to the photon source 112 (cf. one of the dashed lines as an option for the electrical connection of the photon source 112). In this case, the breakdown voltages of the ESD protection diodes 1101, 1102 can correspond or else deviate from one another, depending on what maximum voltages are specified at the respective terminal. The maximally specified voltages are found for example as so-called "absolute maximum voltage limit values" or "absolute limit data" (referred to as "absolute maximum ratings") in the data sheets of the ICs.

The electrical and optical coupling between the ESD protection structure 110 and the photon source 112 as described above affords particular technical advantages in the above-described circuit environment having voltage differences between the first terminal 107 and the second terminal 108 of greater than +10 V and less than −10 V and correspondingly antiseries-configured ESD protection structures 110, since in said circuit environment without the described electrical and optical coupling between the ESD protection structure 110 and the photon source 112 a delay can occur in the triggering behavior of the ESD protection structure 110 on account of a delay of the avalanche breakdown in the ESD protection structure. This effect leads for example to considerable voltage overshoots in the ESD protection structures, which can last up to hundreds of nanoseconds after an ESD pulse has been applied. Such voltage overshoots constitute a considerable hazard for the circuit section to be protected. The delayed triggering behavior in the case of antiseries-configured ESD protection structures originates for example from a reverse pre-bias which, in the case of antiseries-configured ESD protection structure, can be caused by the charging of nodes of high impedance such as, for instance, the terminal point 117 shown in FIG. 2A. Such nodes can be charged for example during an ESD test or in operative operation of the IC and can remain in the charged state until a subsequent ESD test or a subsequent electrostatic discharge during operation of the IC, such that the ESD protection structure is effectively pre-biased in the subsequent ESD test or the subsequent electrostatic discharge during operation of the IC. A pre-bias is a voltage present across a pin combination or across an ESD protection structure, which voltage is present across the pin combination or the ESD protection structure at the initial instant of an ESD discharge and can be for example in the range of from 10 V to the breakdown voltage of the ESD structure.

The optical and electrical coupling between the ESD protection structure 110 and the photon source 112 prevents a delay of avalanche breakdown in the ESD protection structure 110 by virtue of the fact that photons 114 emitted by the photon source 112 when the breakdown voltage of the ESD protection structure 110 is reached are available, the absorption of which photons entails electron-hole pairs which then initiate the avalanche breakdown e.g. with a delay of at most 1 ns.

Figure 2B:
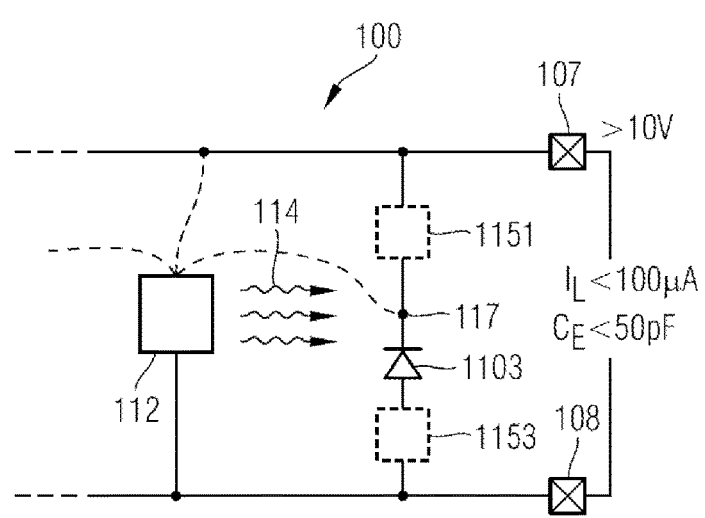
FIG. 2B shows one embodiment of the ESD protection structure illustrated in FIG. 1 with an ESD protection diode at a terminal with low leakage current and low capacitance.

A further embodiment of the ESD protection structure 110 interconnected with a terminal having a low leakage current and a low capacitance is illustrated in the schematic circuit diagram in FIG. 2B. The circuit section 105 interconnected with a first terminal 107 and with the second terminal 108 is operable at a positive voltage difference between the first terminal 107 and second terminal 108 of above +10 V. Moreover, the ESD protection structure 110 embodied as an ESD protection diode is suitable for protecting the circuit section 105 against electrostatic discharge between the first terminal 107 and the second terminal 108, wherein the ESD protection structure 110 is operable with a positive voltage difference between the first terminal 107 and second terminal 108 of above +10 V without triggering. In this embodiment, a leakage current consumption IL between the first terminal 107 and the second terminal 108 at a specified positive maximum voltage is less than 100 nA and an input capacitance between the first terminal 107 and the second terminal 108 is less than 50 pF. In accordance with other embodiments, the leakage current consumption between the first terminal 107 and the second terminal 108 at a specified positive maximum voltage is less than 20 nA and an input capacitance CE between the first terminal 107 and the second terminal 108 is less than 20 pF.

As described in connection with the embodiment according to FIG. 2B, the electrical and optical coupling between the ESD protection structure 110 and the photon source 112 as described above affords particular technical advantages in the circuit environment having a low leakage current consumption and a low input capacitance as described in connection with FIG. 2B, since in the described circuit environment without the electrical and optical coupling between the ESD protection structure 110 and the photon source 112 a delay can occur in the triggering behavior of the ESD protection structure 110 on account of a delay of avalanche breakdown in the ESD protection structure 110 caused by a pre-bias of the ESD protection structure. The pre-bias in the circuit environment in FIG. 2B having a low leakage current consumption and a low input capacitance is caused for example by the pre-pulse voltage phenomenon of ESD test equipment for HBM tests. A displacement current already flows during the process of the closing of the discharge switch in the ESD tester. Depending on leakage current and input capacitance, said displacement current can lead to significant pre-biases of a number of volts.

In a manner corresponding to the embodiment shown in FIG. 2A, the optical and electrical coupling between the ESD protection structure 110 and the photon source 112 in the embodiment shown in FIG. 2B prevents a delay of avalanche breakdown in the ESD protection structure 110 by virtue of the fact that photons 114 emitted by the photon source 112 upon the breakdown voltage of the ESD protection structure 110 being reached, e.g. in a time window from up to 10 ns after said breakdown voltage is reached, are available, the absorption of which photons entails electron-hole pairs which then initiate the avalanche breakdown. In accordance with one embodiment, a specified negative absolute maximum voltage limit value between the first terminal and the second terminal is between −0.3 and −1 V.

FIG. 3A shows one embodiment of the photon source 112 illustrated in FIG. 1, wherein photons 114 are emittable from the photon source 112 as a result of charge carrier recombination of a pn junction operated in the forward direction. The terminals are designated by V+ and GND for ground, by way of example, but can deviate therefrom in other circuit environments in the context of the voltage requirements specified in FIGS. 2A and 2B and comprise for example input terminals, output terminals, supply terminals. In the case of a pn junction operated in the forward direction in silicon, a luminescence spectrum has for instance a narrow peak around a wavelength of 1160 nm with a full width at half maximum (FWHM) of between 70 nm and 120 nm. Consequently, a peak energy of the emitted photons (hv=1.07 eV) is slightly below the band gap energy of silicon ($E_q$=1.12 eV).

FIG. 3B shows a further embodiment of the photon source illustrated in FIG. 1, wherein photons are emittable from the photon source as a result of charge carrier acceleration of a pn junction operated at electrical breakdown in silicon. The terminals are once again designated by V+ and GND for ground by way of example, but can deviate therefrom in other circuit environments in the context of the voltage requirements specified in FIGS. 2A and 2B and comprise for example input terminals, output terminals, supply terminals. For a pn junction operated at electrical breakdown, the luminescence spectra reported were wider than those for forward-biased pn junctions in silicon. The published peak wavelengths vary greatly between values of 500 nm and 1200 nm (infrared light).

The electrical coupling between the ESD protection structure 110 and the photon source 112 is configured such that photons emitted by the photon source 112 upon ESD loading between the first and second terminals 107, 108 are absorbable in the ESD protection structure and an avalanche breakdown is initiatable by means of the electron-hole pairs generated by the absorbed photons.

In accordance with one embodiment, a first voltage $V_1$ between the first terminal and the second terminal, starting from which first voltage a current of at least 100 µA flows through the photon source 112, is between 60% and 120% of a second voltage $V_2$, and the second voltage corresponds to an avalanche breakdown voltage of the ESD protection structure 110.

In accordance with another embodiment, a first voltage $V_1$ between the first terminal and the second terminal, starting from which first voltage a current of at least 1 mA flows through the photon source 112, is between 60% and 120% of a second voltage $V_2$, and the second voltage corresponds to an avalanche breakdown voltage of the ESD protection structure 110.

Between the terminals V+ and GND shown by way of example in FIGS. 3A and 3B and the respective photon source 112, further elements such as the elements 1160, 1161, 1162, 1163, for instance, can be interconnected for optimizing the electrical coupling between the ESD protection structure 110 and the photon source 112. The elements 1162 can be, for instance, reverse- or forward-biased diodes such as, for instance, Zener diodes or diodes inherently present in components such as MOS (metal oxide semiconductor) transistors, such as the body/drain diode, which in turn serve either as further photon emitters and/or for setting the voltage $V_2$.

The photon source 112 is generally a device that emits such radiation which generates electron-hole pairs by means of photon absorption in the ESD protection structure 110. The electron-hole pairs generated within the ESD protection structure 110 can initiate an avalanche breakdown within said device as soon as the voltage across the ESD protection structure reaches the breakdown voltage. By way of example, the photon source 112 can be a diode operated in the forward direction, a diode operated in the reverse direction, e.g. a Zener diode, a MOS device operated in the saturation range, a MOS device in which charge carriers are accelerated with a high electric field in a drain extension region, a modified pn junction composed of silicon having improved optical emission properties such as a lithium-doped pn junction, a junction composed of porous silicon or an amorphous Si—SiN junction. The photon source 112 can be interconnected in series with a triggering circuit, wherein the triggering circuit can be a passive, e.g. differentiating, RC network or an active circuit comprising electronic components.

By way of example, the ESD protection structure 110 can be a diode such as, for instance, a Zener diode or a parasitic diode of a bipolar transistor, a parasitic diode of a field effect transistor (FET) such as a MOSFET, e.g. a body-drain diode or a thyristor such as an SCR (silicon controlled rectifier).

FIG. 4 shows a schematic cross-sectional view of a semiconductor body 130 in which the ESD protection structure 110 and the photon source 112 are formed and have a lateral distance d of less than 50 µm. The semiconductor body 130 is formed for example from silicon (Si), silicon carbide (SiC), germanium (Ge), silicon-germanium (SiGe), gallium nitride (GaN) or gallium arsenide (GaAs). A sufficient optical coupling between the ESD protection structure 110 and the photon source 112 is ensured in the case of a distance d of less than 50 µm in particular in silicon. In accordance with one embodiment, the ESD protection structure 110 and the photon source 112 are formed in a common component region, e.g. a common active area or a common well, and share for example one or a plurality of semiconductor zones such as, for instance, semiconductor wells and/or also electrical terminals. In accordance with a further embodiment, the lateral distance d between the ESD protection structure 110 and the photon source 112 is less than 200 µm, for example with the use of a photon source 112 having a luminescence spectrum having a significant portion around the wavelength of 1160 nm, e.g. a peak in the energy distribution of the generated photons in the range of 80% to 120% of the band gap energy of silicon. In accordance with a further embodiment, the ESD protection structure 110 and the photon source 112 directly adjoin one another, i.e. d is 0 µm. In this case, the ESD protection structure 110 and the photon source 112 are separated from one another for example merely by a component isolation. Component isolations comprise for example pn junction isolations, dielectric isolations such as deep trench isolations (DTI) or else shallow trench isolations (STI).

In accordance with further embodiments, the photons 114 of the photon source 112 can also be guided by means of optical waveguide devices 133 from the photon source to the ESD protection structure 110 as far as a suitable location in order to obtain the required optical coupling. In this case, the distance restrictions mentioned above are unimportant. Furthermore, the photon source can also be formed outside the semiconductor body 130 (cf. photon source 112' in FIG. 4), e.g. above the semiconductor body 130 in a metallization and wiring region or else below the semiconductor body 130. In accordance with a further embodiment, the photon source is embodied in a different semiconductor body than the semiconductor body 130.

The embodiments described entail a series of advantages for example in the case of simple ESD diodes having a current-carrying pn junction as a result of the suppression of the avalanche delay. In this regard, the optically and electrically coupled ESD protection structures and photon sources described generate no additional leakage current, since it is only at ESD-relevant voltages that the photon source appreciably takes up current to generate photons. Likewise, it is possible to realize ESD protection without snap-back behavior, i.e. without rebounds in the current/voltage characteristic curve measurable by means of a TLP (transmission line pulse) measurement, for example. Moreover, it is possible to obtain a smaller expenditure of area than with actively driven ESD structures (e.g. actively driven active components such as bipolar or MOS components) with system level test requirements. In addition, the ESD diodes have little to negligible influence on EMC (electromagnetic compatibility) requirements. In the case of circuit concepts as shown in FIG. 2B, it is also still possible to use ESD testers which do not have a device for avoiding pre-pulse voltages.

Figure 5:
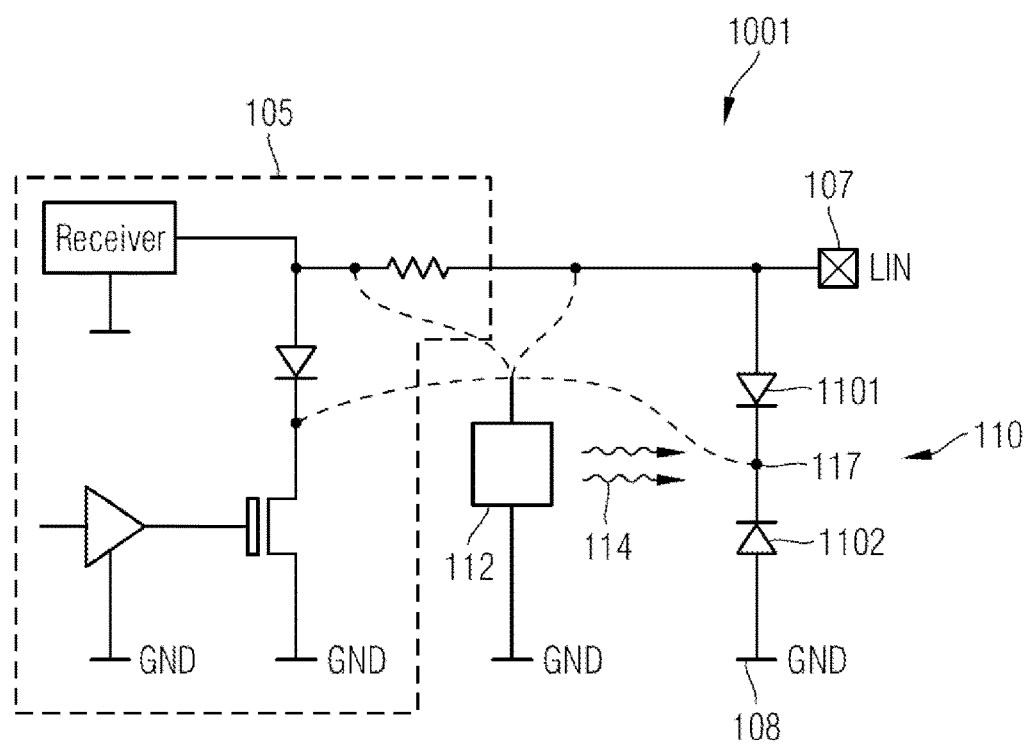
FIG. 5 shows a schematic circuit diagram of part of a single-ended transceiver in the form of an LIN (local interconnect network) transceiver in accordance with one embodiment, in which a circuit section is protected against electrostatic discharge pulses by an ESD protection structure and a photon source electrically and optically coupled thereto.

FIG. 5 shows a schematic circuit diagram of part of a single-ended transceiver in the form of an LIN transceiver 1001 in accordance with one embodiment, in which a circuit section 105 between a bus input/output terminal LIN as first terminal 107 and ground (GND) as second terminal 108 is protected against electrostatic discharge pulses by two antiseries-interconnected ESD protection diodes as ESD protection structure 110 and a photon source 112 electrically and optically coupled thereto.

Figure 6:
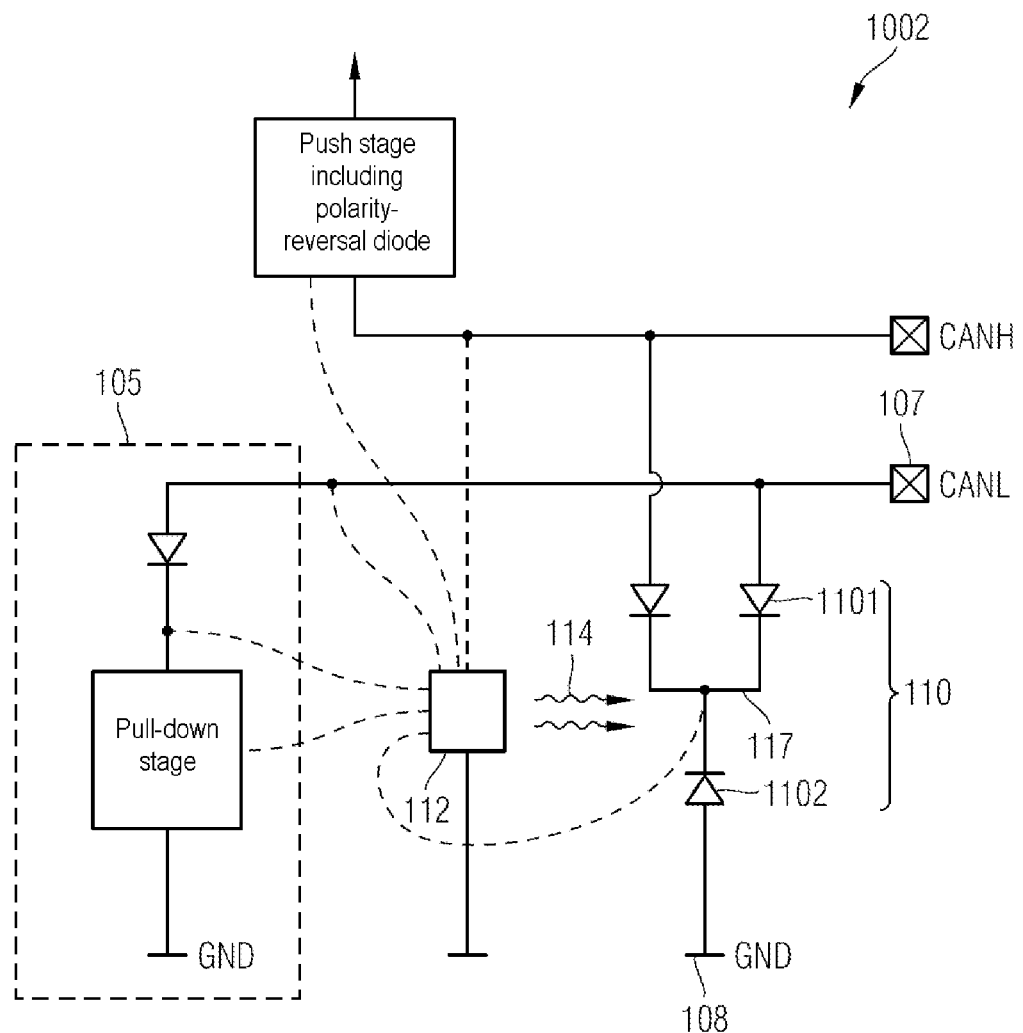
FIG. 6 shows a schematic circuit diagram of part of a single-ended transceiver in the form of a CAN (controller area network) transceiver in accordance with one embodiment, in which a circuit section is protected against electrostatic discharge pulses by an ESD protection structure and a a photon source electrically and optically coupled thereto.

FIG. 6 shows a schematic circuit diagram of part of a differential transceiver in the form of a CAN (controller area network) transceiver 1002 in accordance with one embodiment, in which a circuit section 105 between a bus input/output terminal CANL as first terminal 107 and ground (GND) as second terminal 108 is protected against electrostatic discharge pulses by two antiseries-interconnected ESD protection diodes 1101, 1102 as ESD protection structure 110 and a photon source 112 electrically and optically coupled thereto. A corresponding protection effect is likewise obtained between bus input/output terminal CANH and ground (GND). FIG. 6 shows one advantageous combination of the antiseries ESD protection diodes at CANH and CANL. As a result, only one photon source and one ESD protection diode 1102 are required for both bus terminals. In a further embodiment, dedicated antiseries-interconnected ESD protection diodes and photon sources can be provided at CANH and CANL.

Figure 7:
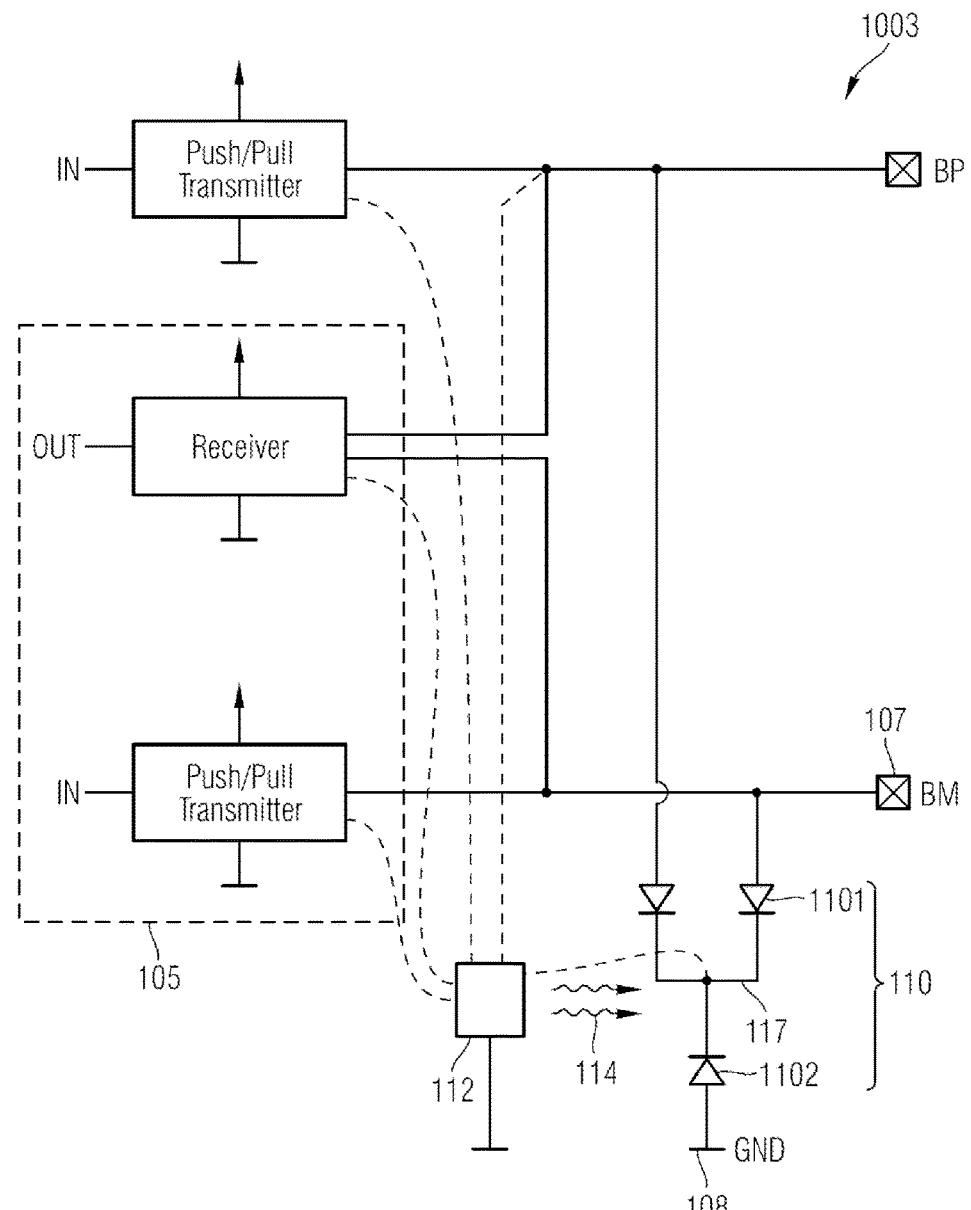
FIG. 7 shows a schematic circuit diagram of part of a single-ended transceiver in the form of a FlexRay transceiver in accordance with one embodiment, in which a circuit section is protected against electrostatic discharge pulses by an ESD protection structure and a photon source electrically and optically coupled thereto.

FIG. 7 shows a schematic circuit diagram of part of a differential transceiver in the form of a FlexRay transceiver 1003 in accordance with one embodiment, in which a circuit section 105 between a bus input/output terminal BM as first terminal 107 and ground (GND) as second terminal 108 is protected against electrostatic discharge pulses by two antiseries-interconnected ESD protection diodes 1101, 1102 as ESD protection structure 110 and a photon source 112 electrically and optically coupled thereto. A corresponding protection effect is likewise obtained between the bus input/output terminal BP and ground (GND). FIG. 7 shows one advantageous combination of the antiseries ESD protection diodes at BM and BP. As a result, only one photon source and one ESD protection diode 1102 are required for both bus terminals. In a further embodiment, independent antiseries-interconnected ESD protection diodes and photon sources can be provided at BM and BP.

Figure 8:
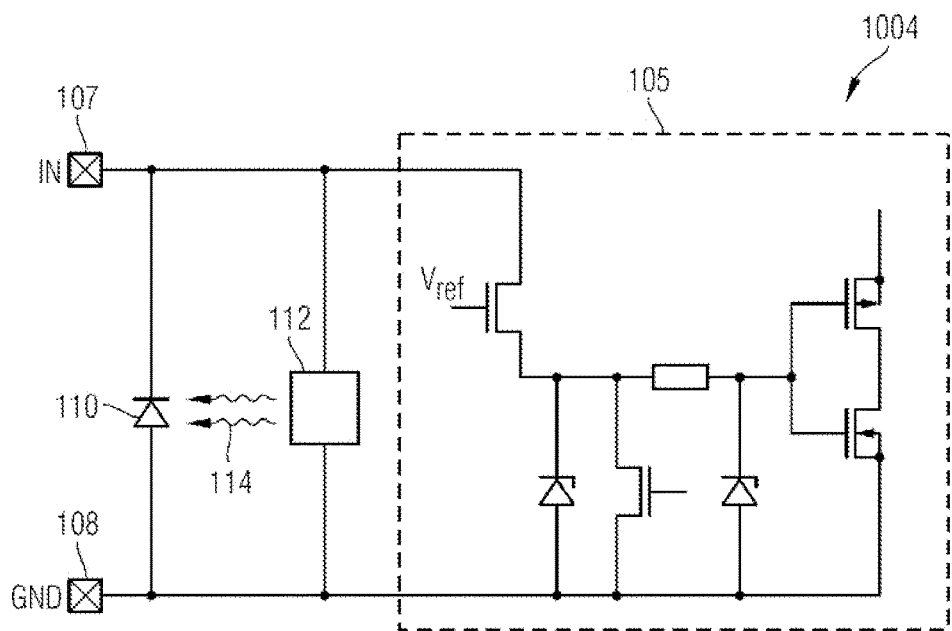
FIG. 8 shows a schematic circuit diagram of part of an integrated circuit with a high-voltage input pin or an overvoltage-tolerant input pin in accordance with one embodiment in which a circuit section is protected against electrostatic discharge pulses by an ESD protection structure and a photon source electrically and optically coupled thereto.

FIG. 8 shows a schematic circuit diagram of part of an integrated circuit 1004 with a high-voltage input pin IN or an overvoltage-tolerant input pin IN in accordance with one embodiment in which a circuit section 105 with an HV-NMOS cascode and optional secondary protection, optional pull-down stage and input buffer is protected against electrostatic discharge pulses by an ESD protection diode as ESD protection structure 110 and a photon source 112 electrically and optically coupled thereto.

Figure 9:
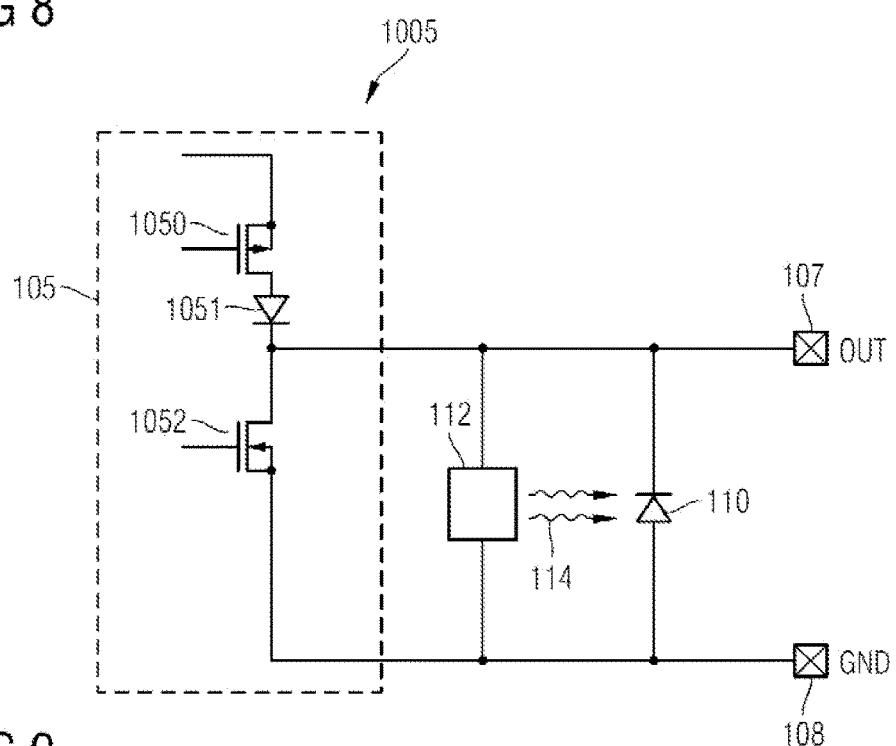
FIG. 9 shows a schematic circuit diagram of part of an integrated circuit with a high-voltage output pin or an overvoltage-tolerant output pin in accordance with one embodiment in which a circuit section is protected against electrostatic discharge pulses by an ESD protection structure and a photon source electrically and optically coupled thereto.

FIG. 9 shows a schematic circuit diagram of part of an integrated circuit 1005 with a high-voltage output pin OUT or an overvoltage-tolerant output pin OUT in accordance with one embodiment in which a circuit section 105 with an output driver comprising a PMOS transistor 1050, a diode 1051 and an NMOS transistor 1052 is protected against electrostatic discharge pulses by an ESD protection diode as ESD protection structure 110 and a photon source 112 electrically and optically coupled thereto.

Figure 10:
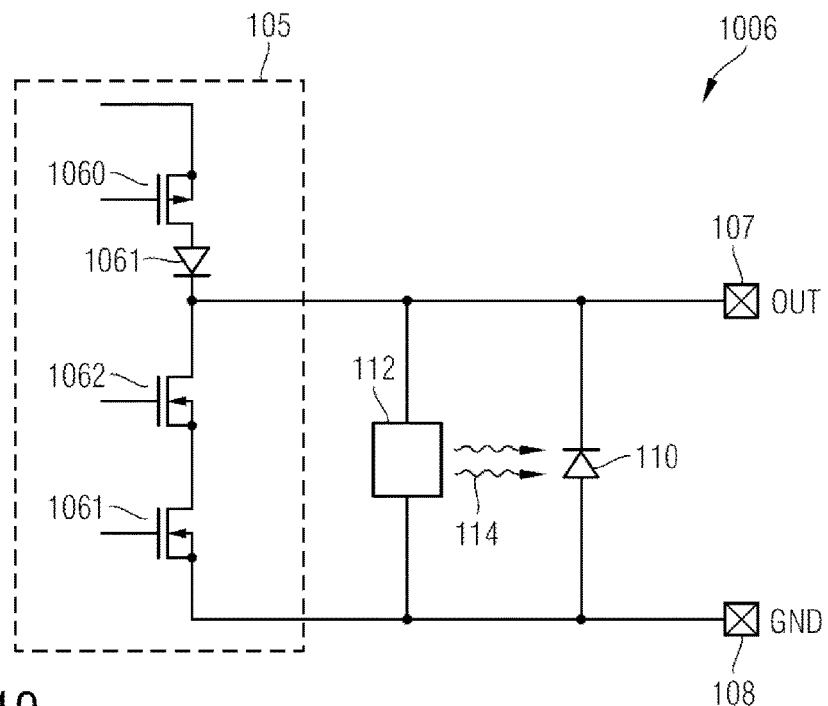
FIG. 10 shows a schematic circuit diagram of part of an integrated circuit with a high-voltage output pin or an overvoltage-tolerant output pin in accordance with a further embodiment in which a circuit section is protected against electrostatic discharge pulses by an ESD protection structure and a photon source electrically and optically coupled thereto.

FIG. 10 shows a schematic circuit diagram of part of an integrated circuit 1006 with a high-voltage output pin OUT or an overvoltage-tolerant output pin OUT in accordance with a further embodiment in which a circuit section 105 comprising a PMOS transistor 1060, a diode 1061 and NMOS transistors 1062, 1063 is protected against electrostatic discharge pulses by an ESD protection diode as ESD protection structure 110 and a photon source 112 electrically and optically coupled thereto.

Figure 11:
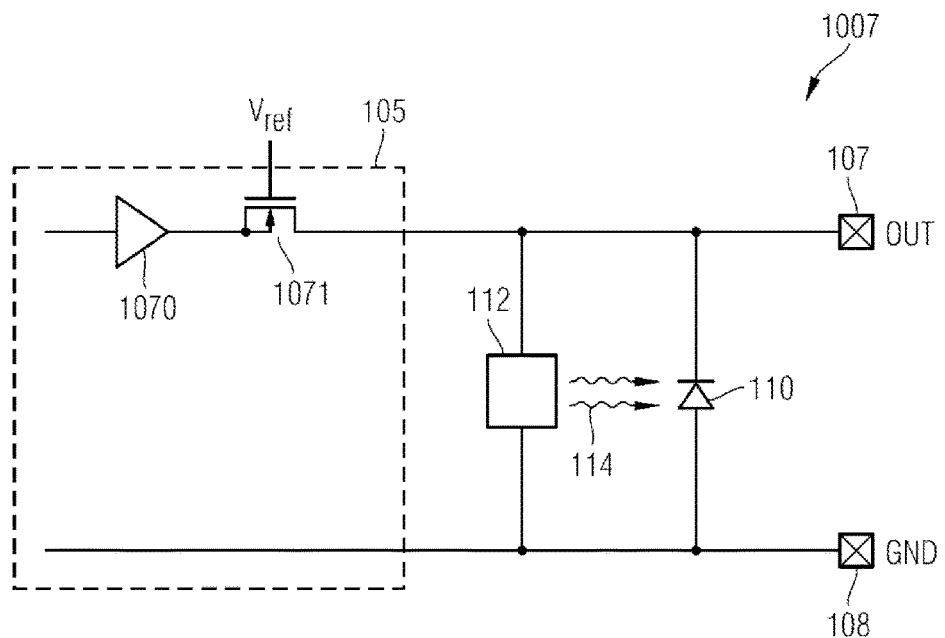
FIG. 11 shows a schematic circuit diagram of part of an integrated circuit with a high-voltage output pin or an overvoltage-tolerant output pin in accordance with another embodiment in which a circuit section is protected against electrostatic discharge pulses by an ESD protection structure and a photon source electrically and optically coupled thereto.

FIG. 11 shows a schematic circuit diagram of part of an integrated circuit 1007 with a high-voltage output pin OUT or an overvoltage-tolerant output pin OUT in accordance with another embodiment, in which a circuit section 105 comprising an output driver 1070 and a pass gate (e.g. realized by the NMOS transistor 1071) is protected against electrostatic discharge pulses by an ESD protection structure 110 embodied as ESD protection diode and a photon source 112 electrically and optically coupled thereto.

Figure 12:
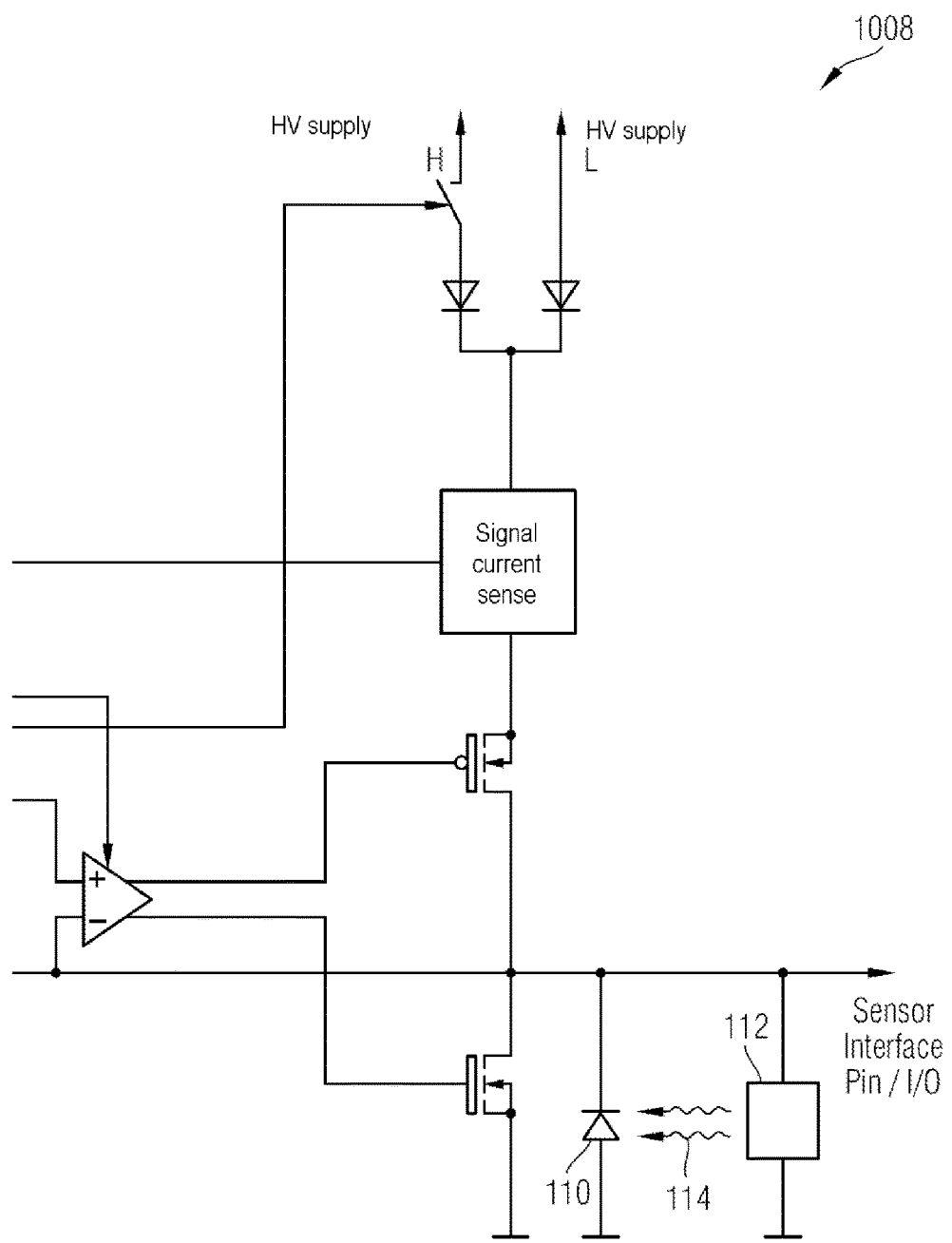
FIG. 12 shows a schematic circuit diagram of part of an integrated circuit with an interface according to PSI5 (peripheral sensor interface 5) and/or DSI (distributed system interface) in accordance with another embodiment in which a circuit section is protected against electrostatic discharge pulses by an ESD protection structure and a photon source electrically and optically coupled thereto.

FIG. 12 shows a schematic circuit diagram of part of an integrated circuit 1008 with an interface according to PSI5 (peripheral sensor interface 5) or DSI (distributed system interface) in accordance with one embodiment in which a circuit section 105 is protected against electrostatic discharge pulses by an ESD protection structure 110 and a photon source 112 electrically and optically coupled thereto.

Figure 13:
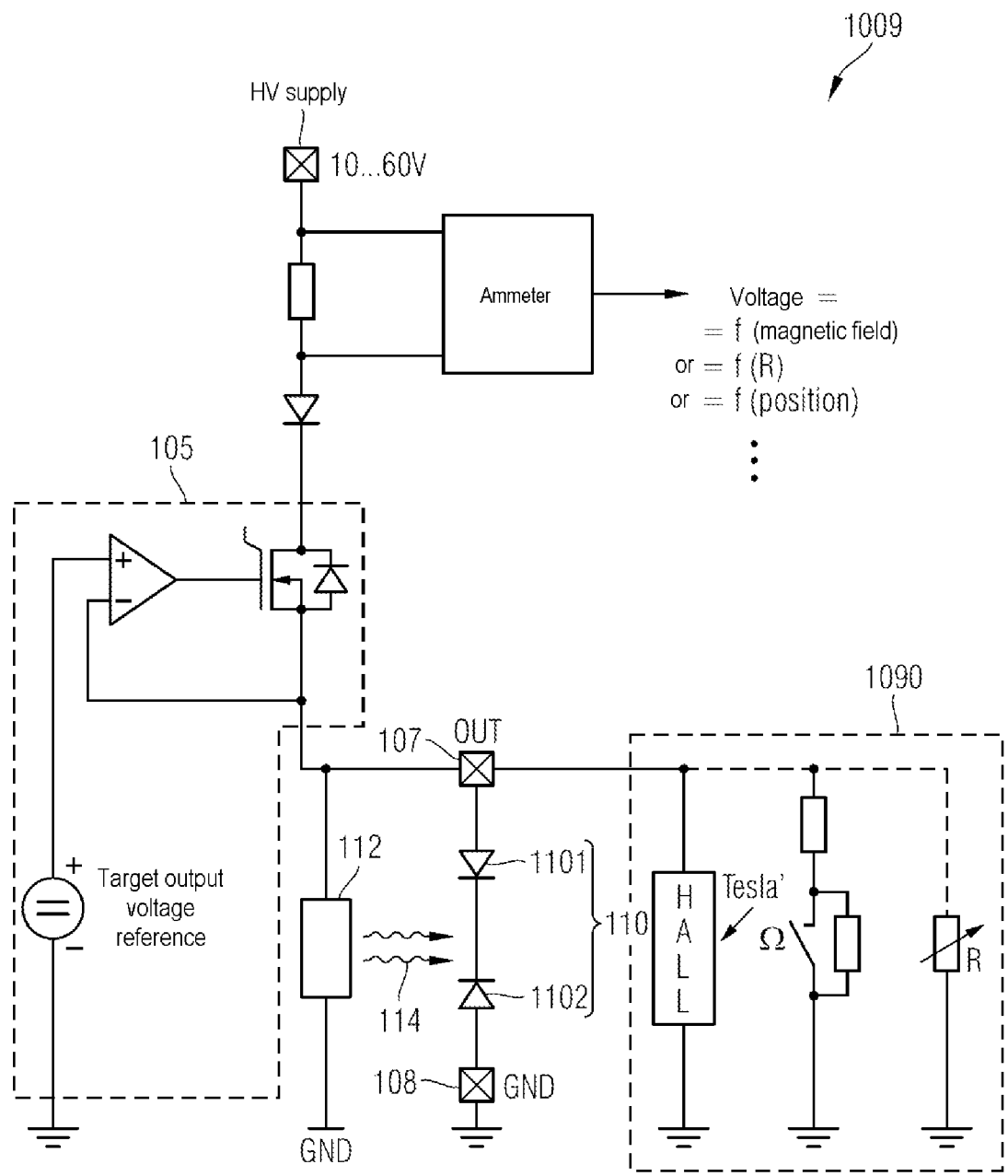
FIG. 13 shows a schematic circuit diagram of part of an integrated circuit with a sensor interface in which a circuit section is protected against electrostatic discharge pulses by an ESD protection structure and a photon source electrically and optically coupled thereto.

FIG. 13 shows a schematic circuit diagram of part of an integrated circuit 1009 with a sensor interface in which a circuit section 105 is protected against electrostatic discharge pulses by two antiseries-interconnected ESD protection diodes 1101, 1102 as ESD protection structure 110 and a photon source 112 electrically and optically coupled thereto. The sensor interface is for example a Hall sensor interface, or a position sensor interface, or a switch monitor interface (also cf. the variants enclosed by dashed lines and identified by 1090).

Figure 14:
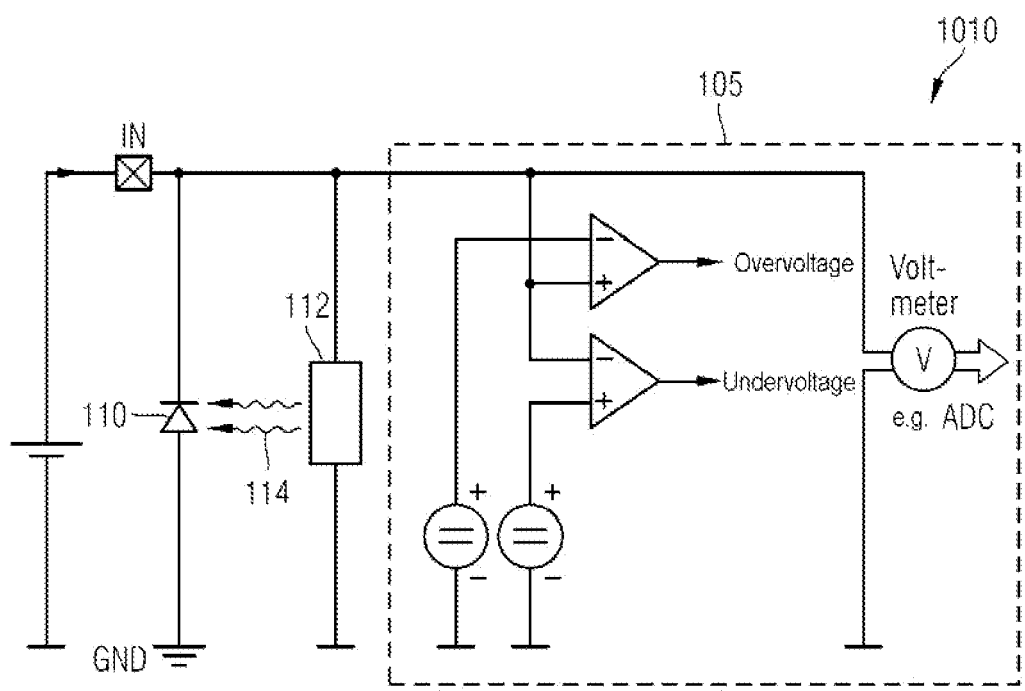
FIG. 14 shows a schematic circuit diagram of part of an integrated circuit with a high-voltage input pin monitor interface in which a circuit section is protected against electrostatic discharge pulses by an ESD protection structure and a photon source electrically and optically coupled thereto.

FIG. 14 shows a schematic circuit diagram of part of an integrated circuit 1010 with a high-voltage input pin monitor interface, in which a circuit section 105 is protected against electrostatic discharge pulses between a high-voltage input pin IN as first terminal 7 and ground (GND) as second terminal 108 by an ESD protection structure 110 embodied as ESD protection diode and a photon source 112 electrically and optically coupled thereto.

Figure 15:
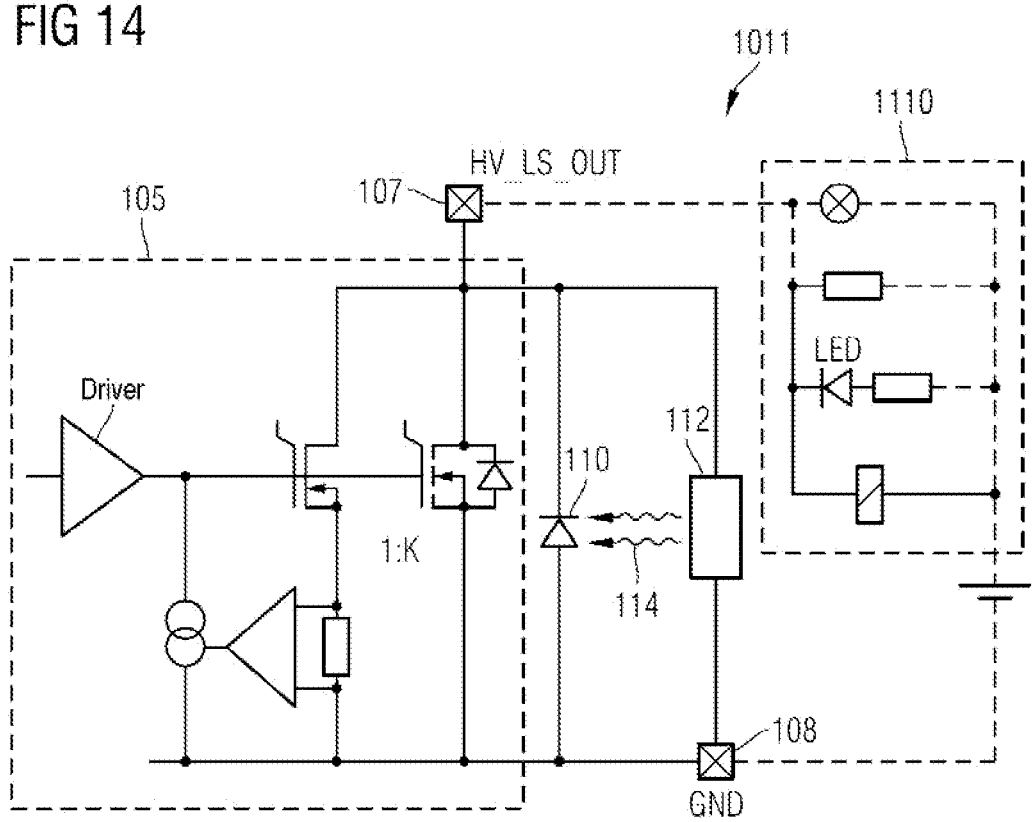
FIG. 15 shows a schematic circuit diagram of part of an integrated circuit with a low-side switch actuator interface in which a circuit section is protected against electrostatic discharge pulses by an ESD protection structure and a photon source electrically and optically coupled thereto.

FIG. 15 shows a schematic circuit diagram of part of an integrated circuit 1011 with a low-side switch actuator interface, in which a circuit section 105 is protected against electrostatic discharge pulses between an output pin HV_L-S_OUT as first terminal 107 and ground (GND) as second terminal 108 by an ESD protection structure 110 embodied as ESD protection diode and a photon source 112 electrically and optically coupled thereto. Exemplary loads are identified by the dashed border 1110.

Figure 16:
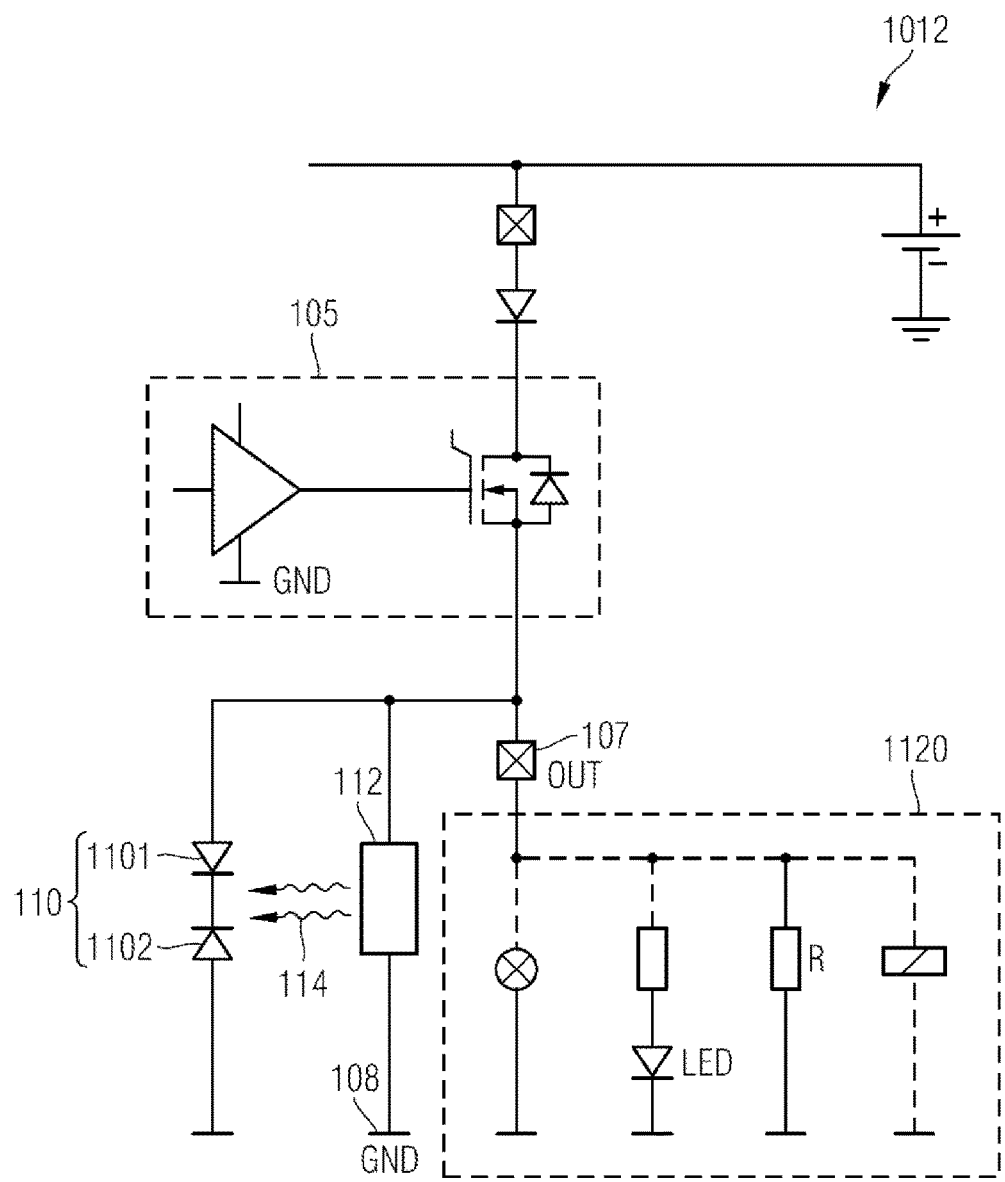
FIG. 16 shows a schematic circuit diagram of part of an integrated circuit with a high-side switch actuator interface in which a circuit section is protected against electrostatic discharge pulses by an ESD protection structure and a photon source electrically and optically coupled thereto.

FIG. 16 shows a schematic circuit diagram of part of an integrated circuit 1012 with a high-side switch actuator interface, in which a circuit section 105 is protected against electrostatic discharge pulses between an output pin OUT as first terminal 107 and ground (GND) as second terminal 108 by two antiseries-interconnected ESD protection diodes 1101, 1102 as ESD protection structure 110 and a photon source 112 electrically and optically coupled thereto. Exemplary loads are identified by the dashed border 1120.

Figure 17:
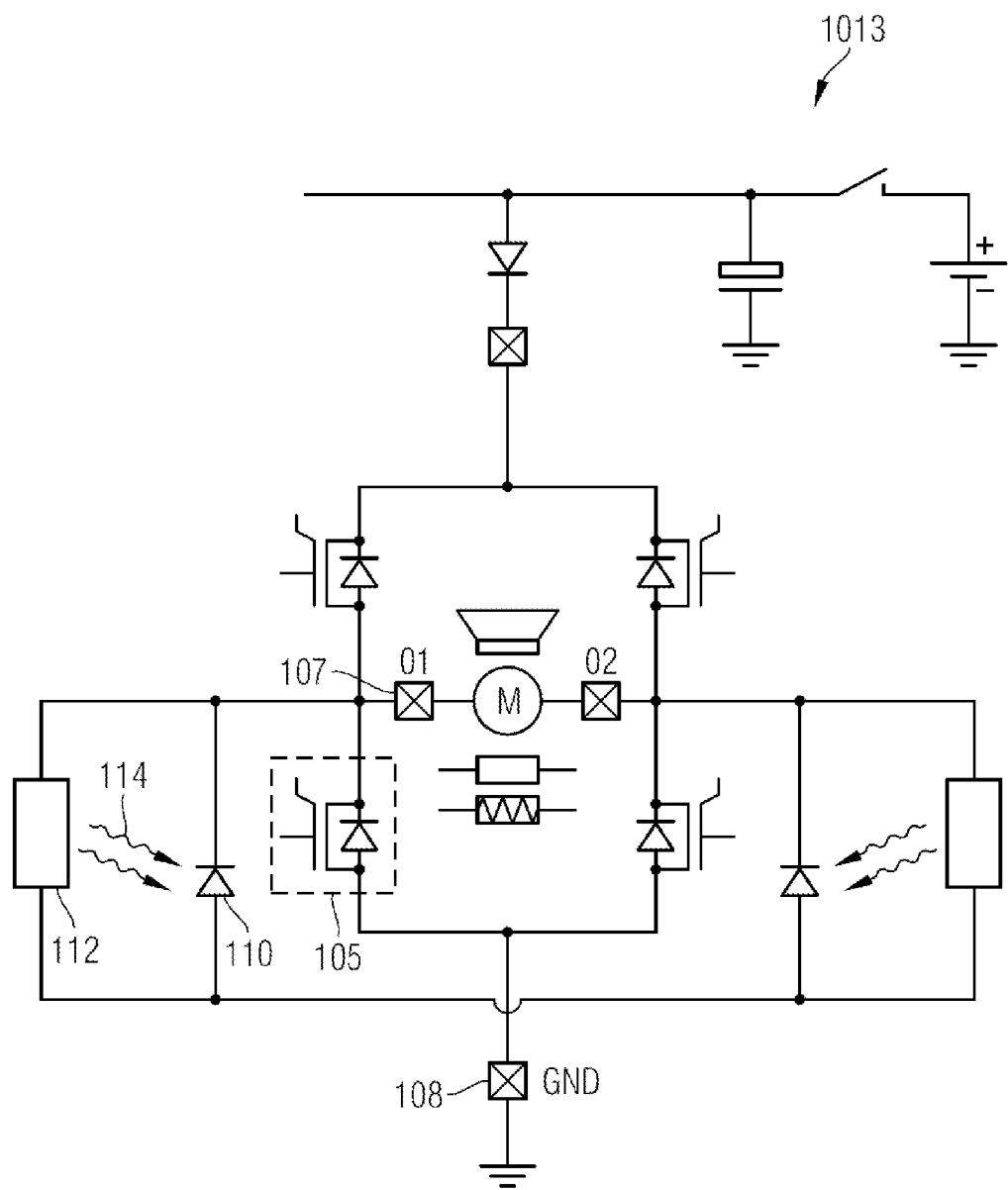
FIG. 17 shows a schematic circuit diagram of part of an integrated circuit with a half- or full-bridge actuator interface in which a circuit section is protected against electrostatic discharge pulses by an ESD protection structure and a photon source electrically and optically coupled thereto.

FIG. 17 shows a schematic circuit diagram of part of an integrated circuit 1013 with a half- or full-bridge actuator interface, in which a circuit section 105 is protected against electrostatic discharge pulses between an input pin 01 as first terminal 107 and ground (GND) as second terminal 108 by an ESD protection structure 110 embodied as ESD protection diode and a photon source 112 electrically and optically coupled thereto. A corresponding protection function is obtained in the opposite bridge part in the case of the output pin 02 by transfer of the ESD protection concept.

Although specific embodiments have been illustrated and described here, for the person skilled in the art it goes without saying that a multiplicity of alternatives and/or equivalent embodiments can be implemented for the specific exemplary embodiments shown and described, without departing from the scope of the present invention. This application is intended to cover all adaptations or modifications of the specific exemplary embodiments discussed here. Therefore, the intention is that this invention shall be limited only by the patent claims and the equivalents thereof.

What is claimed is:
1. An integrated circuit, comprising:
a circuit section interconnected with a first terminal and with a second terminal and operable at voltage differences between the first terminal and the second terminal of greater than +10 V and less than −10 V; and
an ESD protection structure operable to protect the circuit section against ESD loading between the first terminal and the second terminal,
wherein the ESD protection structure is operable with voltage differences between the first and second terminals of greater than +10 V and less than −10 V without triggering,
wherein the ESD protection structure is electrically and optically coupled to a photon source so that photons emitted by the photon source upon ESD loading are absorbable in the ESD protection structure and an avalanche breakdown is initiatable by electron-hole pairs generated by the absorbed photons, wherein the integrated circuit comprises a differential transceiver.

2. The integrated circuit of claim 1, wherein the ESD protection structure comprises two antiseries-interconnected ESD protection diodes.

3. The integrated circuit of claim 2, wherein an ESD pulse is dissipatable in the ESD protection diodes in electrical breakdown operation of a pn junction between a p-type region and an n-type region.

4. The integrated circuit of claim 1, wherein the ESD protection structure and the circuit section are operable at voltage differences between the first terminal and the second terminal of greater than +20 V and less than −20 V.

5. The integrated circuit of claim 1, wherein the differential transceiver is a CAN transceiver and the circuit section is interconnected with one terminal from a CANH bus input/output terminal, a CANL bus input/output terminal, and ground as the first terminal, and with another terminal from the CANH bus input/output terminal, the CANL bus input/output terminal, and ground as the second terminal.

6. The integrated circuit of claim 1, wherein the differential transceiver is a FlexRay transceiver, and the circuit section is interconnected with one terminal from a bus line positive terminal, a bus line negative terminal, and ground as the first terminal, and with another terminal from the bus line positive terminal, the bus line negative terminal, and ground as the second terminal.

7. An integrated circuit, comprising:
a circuit section interconnected with a first terminal and with a second terminal and operable at a positive voltage difference between the first terminal and second terminal of above +10 V; and
an ESD protection structure operable to protect the circuit section against electrostatic discharge between the first terminal and the second terminal,
wherein the ESD protection structure is operable with a positive voltage difference between the first and second terminals of above +10 V without triggering,
wherein the ESD protection structure is electrically and optically coupled to a photon source such that photons emitted by the photon source upon ESD pulse loading are absorbable in the ESD protection structure and an avalanche breakdown is initiatable by electron-hole pairs generated by the absorbed photons,
wherein a leakage current consumption between the first terminal and the second terminal at a specified positive maximum voltage is less than 100 nA and an input capacitance between the first terminal and the second terminal is less than 50 pF,
wherein the circuit section is a sensor interface.

8. The integrated circuit of claim 7, wherein a specified negative absolute maximum voltage limit value between the first terminal and the second terminal is between −0.3 V and −1 V.

9. The integrated circuit of claim 7, wherein a specified maximum positive operating voltage between the first terminal and the second terminal is greater than +20 V.

10. The integrated circuit of claim 9, wherein the first terminal is an input terminal or an output terminal and the second terminal is a ground terminal.

11. The integrated circuit of claim 7, wherein a first voltage $V_1$ between the first terminal and the second terminal, starting from which first voltage a current of at least 100 µA flows through the photon source, is between 60% and 120% of a second voltage $V_2$, and the second voltage corresponds to an avalanche breakdown voltage of the ESD protection structure.

12. The integrated circuit of claim 7, wherein at least one terminal of the ESD protection structure and a terminal of the photon source are electrically connected.

13. The integrated circuit of claim 7, wherein the photons are emittable from the photon source as a result of charge carrier recombination of a pn junction operated in the forward direction in silicon.

14. The integrated circuit of claim 7, wherein the photons are emittable from the photon source as a result of charge carrier acceleration of a pn junction operated in electrical breakdown in silicon.

15. The integrated circuit of claim 7, wherein the photons are emittable from the photon source as a result of charge carrier acceleration in an electric field of a MOS channel operated in saturation, a MOS drain extension region, or a drain drift path in silicon.

16. The integrated circuit of claim 7, wherein the ESD protection structure and the photon source are formed in a silicon semiconductor body with a distance of less than 50 µm.

17. The integrated circuit of claim 7, wherein the ESD protection structure and the photon source are formed in a silicon semiconductor body with a distance of less than 200 µm and the photon source has a luminescence spectrum whose energy distribution has a peak in the range of 80% to 120% of the band gap energy of silicon.

18. The integrated circuit of claim 7, wherein the photon source is electrically connected at at least one terminal to at least one of the first terminal, the second terminal, a central node of two antiseries-interconnected ESD diodes, an ESD secondary protection structure and the circuit section.

19. The integrated circuit of claim 7, wherein the photon source is electrically and optically coupled to a plurality of ESD protection structures.

20. The integrated circuit of claim 7, wherein the sensor interface is one of a Hall sensor interface, a buckle switch interface, a battery sensor interface, an active peripheral sensor interface, a distributed system interface, a peripheral sensor interface, a high-voltage sensor pin interface, a monitor pin sensor interface, a position sensor interface, or a switch feedback unit sensor interface.

21. The integrated circuit of claim 7, wherein the first terminal is a terminal from a voltage sensor pin, a switch monitor pin, an input pin, or an output pin.

22. An integrated circuit, comprising:
a circuit section interconnected with a first terminal and with a second terminal and operable at voltage differences between the first terminal and the second terminal of greater than +10 V and less than −10 V; and
an ESD protection structure operable to protect the circuit section against ESD loading between the first terminal and the second terminal,
wherein the ESD protection structure is operable with voltage differences between the first and second terminals of greater than +10 V and less than −10 V without triggering,
wherein the ESD protection structure is electrically and optically coupled to a photon source so that photons emitted by the photon source upon ESD loading are absorbable in the ESD protection structure and an avalanche breakdown is initiatable by electron-hole pairs generated by the absorbed photons,
wherein the integrated circuit comprises a single-ended transceiver.

23. The integrated circuit of claim 22, wherein the single-ended transceiver is an LIN transceiver and the circuit section is interconnected with a bus input/output terminal as the first terminal and with a ground connection terminal as the second terminal.

24. An integrated circuit, comprising:
- a circuit section interconnected with a first terminal and with a second terminal and operable at a positive voltage difference between the first terminal and second terminal of above +10 V; and
- an ESD protection structure operable to protect the circuit section against electrostatic discharge between the first terminal and the second terminal,
- wherein the ESD protection structure is operable with a positive voltage difference between the first and second terminals of above +10 V without triggering,
- wherein the ESD protection structure is electrically and optically coupled to a photon source such that photons emitted by the photon source upon ESD pulse loading are absorbable in the ESD protection structure and an avalanche breakdown is initiatable by electron-hole pairs generated by the absorbed photons,
- wherein a leakage current consumption between the first terminal and the second terminal at a specified positive maximum voltage is less than 100 nA and an input capacitance between the first terminal and the second terminal is less than 50 pF,
- wherein the circuit section is an actuator interface.

25. The integrated circuit of claim 24, wherein the actuator interface is an interface from a high side switch, a low side switch, a half-bridge, or a full bridge.

\* \* \* \* \*